Jan. 28, 1969 E. E. BAXTER 3,424,854

MULTILAYER PRINTED CIRCUIT WITH SOLDERED EYELETS FORMING THE SOLE MEANS JOINING THE SAME

Original Filed March 10, 1965

Inventor:-
Emery E. Baxter,
By Mueller, Aichele & Rauner Attys.

United States Patent Office 3,424,854

Patented Jan. 28, 1969

3,424,854

MULTILAYER PRINTED CIRCUIT WITH SOLDERED EYELETS FORMING THE SOLE MEANS JOINING THE SAME

Emery E. Baxter, Mount Prospect, Ill., assignor to Motorola, Inc., Franklin Park, Ill., a corporation of Illinois Continuation of application Ser. No. 438,606, Mar. 10, 1965. This application July 20, 1967, Ser. No. 654,933

U.S. Cl. 174—68.5 2 Claims

Int. Cl. H05k *1/04*

ABSTRACT OF THE DISCLOSURE

This device is a multi-layer circuit having an insulating base with a first layer of printed circuitry mounted on it. An insulating layer covers the first layer of printed circuitry and has a second layer of printed circuitry disposed on it. A plurality of funnel shaped eyelets pass through one or both of the insulating layers and selectively engage the first and second layers of printed circuitry. The eyelets bind all the layers together to form the multi-layer circuit.

*Cross-reference to related applications*

This application is a continuation of application Ser. No. 438,606, filed Mar. 10, 1965, and now abandoned.

This invention pertains to printed circuit boards and more particularly to the construction of multi-layer printed circuit structures.

Various means have been used for bonding together individual layers of printed circuit boards to form a multi-layer printed circuit structure. Two of the more common methods which have been used are the "plate through" process and the "indium pin" method. In multi-layer printed circuits so constructed it is not possible to inspect the soldered connections between the terminals, the circuit components and the conducting paths of the covered or bottom layer of printed circuitry. Even though the soldered connections look electrically good, only a thin ribbon may be completing the electrical circuit which ribbon, when subjected to temperature changes, will part causing failure of the adjacent components. Therefore, in order to obtain a high degree of reliability in multi-layer printed circuits, it is extremely desirable to be able to inspect and repair if necessary the soldered connections on the covered layer of printed circuitry. Furthermore, the use of glue to bond the layers together adds appreciably to the cost of making the printed circuit.

It is, therefore, an object of this invention to provide an improved multi-layer printed circuit, and an improved process for making the same.

Another object of this invention is to provide a multi-layer printed circuit that permits inspection of the soldered connections on the bottom or covered layer of printed circuitry.

A further object of this invention is to provide a multi-layer printed circuit with access to the bottom layer of circuitry to effect repairs to the soldered connections located thereon.

Still another object of this invention is to provide a multi-layer printed circuit which eliminates the use of a bonding agent between the layers thereby reducing the manufacturing cost.

One feature of this invention is the provision of a circuit assembly including an insulating base with a first layer of printed circuitry mounted thereon, and an insulating layer covering the first layer of printed circuitry with a second layer of printed circuitry disposed thereon. A plurality of funnel flared eyelets pass through one or both insulating layers, with each eyelet engaging one of the first and second layers of printed circuitry and solder connecting the eyelets to their respectively engaged printed circuits.

Another feature of this invention is the provision of a multi-layer printed circuit assembly having the layers of printed circuitry held together in proper alignment by funnel flared eyelets passing through the layers and being solder connected to their respective printed circuits.

Still another feature of this invention is the provision of a multi-layer printed circuit structure wherein the covering insulating layer has openings encircling the eyelets engaging the first layer of printed circuitry thereby providing access to these eyelets, while the eyelets engaging the second layer of printed circuitry are spaced from the eyelets engaging the first layer to prevent short circuitry of the first printed circuit to the second printed circuit during the soldering operation.

Yet another feature of this invention is the provision of a multi-layer printed circuit having eyelets engaging the first and second layers of printed circuitry which lie in approximately the same plane so that they can be simultaneously soldered to the first and second printed circuits.

Figure 1:
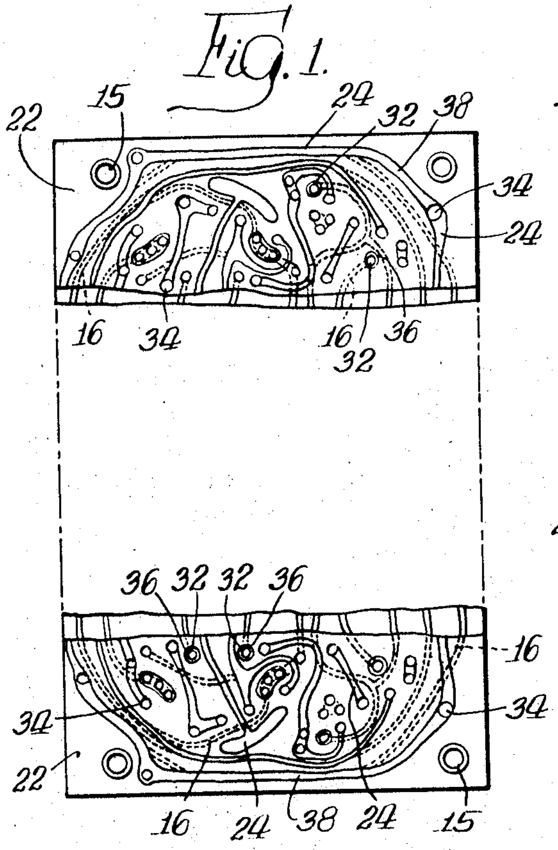
FIG. 1 is a plan view showing a part of the completed multi-layer circuit board.
Figure 2:
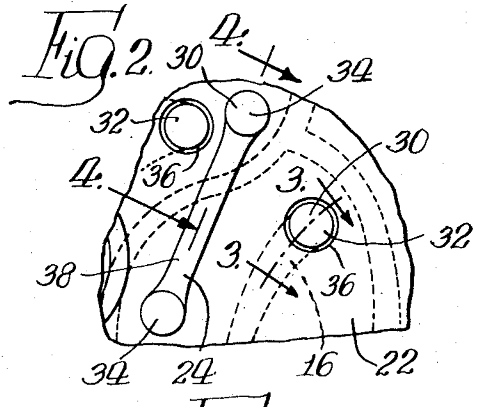
FIG. 2 is a magnified portion of FIG. 1.
Figure 3:
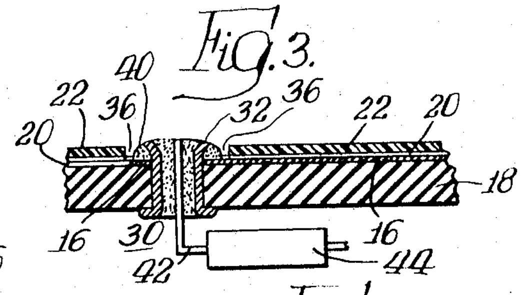
FIG. 3 is a section view of the completed multi-layer circuit board taken along line 4—4 of FIG. 2.

The multi-layer printed circuit structure of this invention includes a flat insulating base with a first printed circuit mounted thereon. A solder resist may be silk screened on the first printed circuit. A second printed circuit is provided by an insulating layer having a second conductive layer disposed thereon. The second printed circuit is placed on the first printed circuit with the insulating layer engaging the solder resist. A plurality of funnel flared eyelets are then passed through the insulating layer and engage either the first or second layers of printed circuitry. The insulating layer has openings in it that expose the eyelets engaging the first layer of printed circuitry and providing access thereto. The eyelets extending through the insulating layer and engaging the second layer of printed circuitry are spaced clear of the first printed circuit. The printed circuit so constructed has both sets of eyelets lying in approximately the same plane so that, when it is dip soldered, the solder simultaneously connects the eyelets with the associated conductive layers. This results in the funnel flared eyelets and the soldered connections cooperating to bind together and provide proper alignment for the multiple layers of the printed circuit.

The words "printed circuit" as used in this application mean an insulating sheet having conducting layers thereon wherein the layers are formed by printing, plating, deposition, etching or any other process.

Construction of the multi-layer circuit of this invention can be best understood by referring to FIGS. 1 through 4 of the drawing. Although the following description is for the construction of two layers of printed circuitry, the invention is not limited to this number and additional layers could be added.

In FIGS. 1 through 4 the insulating base 18 made of phenolic or similar material having a thickness, for instance, of 1/16 inch, has a conductive layer of copper 16 thereon. The conductive layer may be formed by etching away portions of a copper clad layer, or by depositing the layer on the base by some known process. An overcoat 20 of melamine or similar material is silk screened on the first layer of printed circuitry 16. This overcoat serves as a solder resist and also protects the copper from corrosion when it is subsequently covered by additional layers.

After the base circuit is completed, the eyelets or locating pins 15 are installed in base 18. In addition to providing means for mounting the printed circuit, locating pins serve as reference points for locating the subsequent layers on the base 18. Insulating sheet or layer 22 of glass epoxy or similar material, which may be thinner than the base 18 with a thickness for instance of twelve thousandths of an inch, is assembled to the locating pins 15. The locating pins properly locate the layer 22 with respect to the base 18 so that layer 22 covers the first layer of printed circuitry 16. A second conductive layer of copper 24 is disposed on the thin insulating sheet 22 prior to mounting in a manner similar to that used in laying the first conductive layer 16. When layer 22 is assembled to the locating pins 15, the layer of copper 24 forms a second layer of printed circuitry 24.

Figure 4:
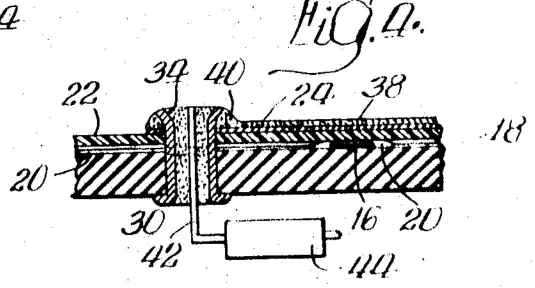
FIG. 4 is a section view similar to FIG. 3 taken along the line 5—5 of FIG. 2.

Funnel flared eyelets or connectors 30 (made of copper or a similar conductor) are forced through preplanned apertures passing through the various layers 24, 22, 16 and the base 18. One group 32 of eyelets 30 pass through the base 18, insulating layer 22 and engage the first layer of printed circuitry 16. Another group 34 of eyelets 30 pass through base 18, insulating layer 22 and engage the second layer of printed circuitry 24. The insulating layer 22 has openings 36 threin that are aligned with and encircle the group 32 of eyelets 30. These openings 36 provide access to the eyelets 32 and the printed circuit 16 adjacent thereto subsequent to the covering of the printed circuit 16 by the insulating layer 22. The eyelets 34 that engage the second layer of printed circuitry 24, are spaced from the eyelets 32 as indicated in FIG. 4 to prevent short circuiting of the first printed circuit to the second printed circuit during the soldering operation.

Leads 42 from the circuit components 44 are inserted in the eyelets 30 and held in a fixed relation to the base 18 in a known manner in preparation for the solder dipping process. Dipping the assembly in a solder bath provides solder connection of the circuit components to the first and second layers of printed circuitry. Because the insulated layer 22 is thin in comparison to the base 18, the exposed areas to be connected, that is, those areas between the eyelets 32 and 34 and their associated printed circuits 16 and 24 respectively lie in approximately the same plane so that the soldered terminal connections 40 are completed simultaneously necessitating only one dipping per multi-layer board 10.

The solder resist 20 covering the first layer of printed circuitry 16 aided by the selective placement of the eyelets 34, insures that the solder 38 will not run between paths of the printed circuits or betwen the eyelets 30, thereby causing short circuiting of the circuit components. The copper conductive layer forming the second layer of printed circuitry 24 is covered by the solder 38 when the multi-layer circuit is dipped into the solder bath. The solder 38 covering the copper protects that layer from corrosion and provides excellent connecting joints.

The eyelets 30 and 15 cooperating with the soldered joints 40 effectively bind together the various layers of the multi-layer printed circuit 10 without the use of glue as a bonding agent. In addition, the soldered joints 40 between the eyelets 32 and the first layer of printed circuitry 16 are visible through the openings 36 and may be inspected to insure proper jointing. If the soldered connection is poor, the solder at that particular joint may be removed and the joint resoldered by hand to insure proper connection without removing the top layer of printed circuitry 24.

Figure 5:
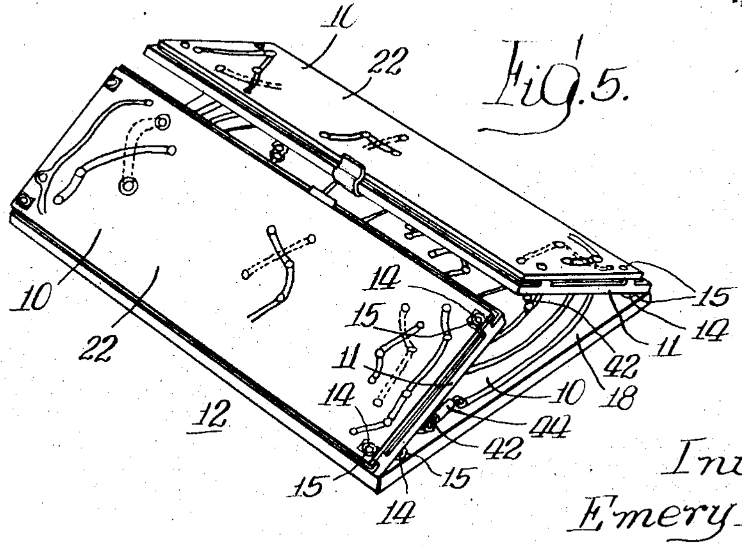
FIG. 5 is a perspective view showing a completed multi-layer circuit board typically mounted in a piece of electronic equipment.

FIG. 5 shows completed multi-layer circuits 10 attached to support brackets 11 of a piece of electronic equipment 12 by screws 14 passing through eyelets 15. The piece of electronic equipment 12 could be used in a car radio telephone set, for instance, where the requirement for compactness necessarily dictates a high concentration of circuit components per each printed circuit. To accommodate this high concentration of components while retaining the advantages of printed circuitry, it was necessary to develop multi-layer printed circuits.

This construction of a multi-layer printed circuit, therefore, is relatively inexpensive and provides for a means to inspect, and repair, if necessary, the terminal connections on both layers of printed circuitry without removing the top layer. In addition, a plurality of multi-layer circuit boards supporting a high concentration of circuit components may be assembled to form a compact piece of electronic equipment such as shown in FIG. 5.

I claim:

1. A multi-layer printed circuit device, including in combination, a first flat insulating base having a relatively substantial thickness and a first layer of printed circuitry thereon, a solder resist covering said first layer of printed circuitry, an insulating layer relatively thin compared to said first insulating base forming a second insulating base and having a second layer of printed circuitry disposed thereon, said second insulating base being positioned on said first layer of printed circuitry and said first insulating base, a plurality of eyelets passing through said first base, a first group of said eyelets engaging said first layer of printed circuitry, said second base having openings about said eyelets of said first group affording access thereto, a second group of said eyelets extending through said first base and said second base with a predetermined number thereof engaging said second layer of printed circuitry, circuit components having leads extending into said eyelets for connection to said first and second layers of printed circuitry, and solder connecting said component leads to said eyelets, said solder further connecting said predetermined number of said eyelets in said second group to said second layer of printed circuitry and being deposited in said openings about said first eyelets in said second base to connect said eyelets of said first group to said first layer of printed circuitry, said eyelets of said second group cooperating with said solder connecting said predetermined number of said eyelets of said second group to form the sole means for joining said first and second bases and said layers of printed circuitry together to form a multi-layer printed circuit device, said solder resist preventing said solder from running between circuit paths of said first layer of printed circuitry or between said eyelets of said first group to cause short circuiting of said circuit components.

2. The multi-layer printed circuit device of claim 1 wherein said solder covers said second layer of printed circuitry thereby protecting the same from corrosion.

References Cited

UNITED STATES PATENTS

| | | | |
|---|---|---|---|
| 2,547,022 | 4/1951 | Leno. | |
| 2,611,010 | 9/1952 | Sass et al. | 174—68.5 XR |
| 2,734,150 | 2/1956 | Beck et al. | 174—68.5 |
| 2,932,772 | 4/1960 | Bowman et al. | 174—68.5 XR |
| 3,052,823 | 9/1962 | Anderson et al. | 174—68.5 XR |
| 3,228,091 | 1/1966 | Rice et al. | 174—68.5 XR |

DARRELL L. CLAY, *Primary Examiner*.

U.S. Cl. X.R.

317—101; 339—17; 29—625, 626